United States Patent
Park et al.

(10) Patent No.: US 11,078,571 B2
(45) Date of Patent: Aug. 3, 2021

(54) DEPOSITION APPARATUS INCLUDING A HEAT DISSIPATION MEMBER

(71) Applicant: Samsung Display Co., Ltd., Yongin-Si (KR)

(72) Inventors: Jongho Park, Hwaseong-si (KR); Sook-hwan Ban, Asan-si (KR); Jinoh Song, Seoul (KR); Hyeongsuk Yoo, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 49 days.

(21) Appl. No.: 16/709,152

(22) Filed: Dec. 10, 2019

(65) Prior Publication Data
US 2020/0190668 A1    Jun. 18, 2020

(30) Foreign Application Priority Data
Dec. 12, 2018    (KR) .................... 10-2018-0160248

(51) Int. Cl.
*C23C 16/455*    (2006.01)
*H01J 37/32*    (2006.01)

(52) U.S. Cl.
CPC .... *C23C 16/45572* (2013.01); *H01J 37/3244* (2013.01); *H01J 2237/3321* (2013.01)

(58) Field of Classification Search
CPC ......... C23C 16/45572; C23C 16/45565; H01J 37/3244; H01J 2237/3321
See application file for complete search history.

(56) References Cited

U.S. PATENT DOCUMENTS

| | | |
|---|---|---|
| 6,218,320 B1 | 4/2001 | Lu et al. |
| 6,444,042 B1 | 9/2002 | Yang et al. |
| 7,411,161 B2 | 8/2008 | Kim |
| 7,628,863 B2 | 12/2009 | Sen et al. |
| 9,200,368 B2 | 12/2015 | Choi et al. |
| 2009/0071403 A1 | 3/2009 | Choi et al. |

FOREIGN PATENT DOCUMENTS

| | | |
|---|---|---|
| KR | 10-0280519 | 11/2000 |
| KR | 10-0328820 | 3/2002 |
| KR | 10-0826432 | 4/2008 |

OTHER PUBLICATIONS

Michael Klicke, et al., "Quality Management by Advanced Process Control in Large Area PECVD", 10th European Advanced Equipment Control/ Advanced Process Control (AEC/APC) Conference, pp. 1-21 Hotel Sheraton Catania, Apr. 28-30, 2010.

*Primary Examiner* — Yuechuan Yu
(74) *Attorney, Agent, or Firm* — F. Chau & Associates, LLC

(57) ABSTRACT

A deposition apparatus includes a chamber, a deposition source, and a stage disposed in the chamber with a target object mounted thereon. The deposition apparatus further includes a first plate coupled to the chamber, and a second plate disposed between the first plate and the stage, wherein the second plate includes a plurality of diffusion holes. The deposition apparatus additionally includes a heat dissipation member in contact with the first plate and the second plate, wherein the heat dissipation member includes a plurality of sidewall portions, wherein the plurality of sidewall portions are connected to each other. The deposition apparatus further includes a spacer coupled to a first sidewall portion of the plurality of sidewall portions and disposed between the first plate and the second plate, wherein the spacer extends parallel to the first sidewall portion.

20 Claims, 12 Drawing Sheets

DEPOSITION APPARATUS INCLUDING A HEAT DISSIPATION MEMBER

CROSS-REFERENCE TO RELATED APPLICATION

This U.S. non-provisional patent application claims priority under 35 U.S.C. § 119 to Korean Patent Application No. 10-2018-0160248, filed on Dec. 12, 2018, in the Korean Intellectual Property Office, the disclosure of which is incorporated by reference herein in its entirety.

TECHNICAL FIELD

The present disclosure relates to deposition apparatus, and more particularly, to a deposition apparatus including a heat dissipation member.

DISCUSSION OF THE RELATED ART

A glass or plastic substrate is widely used to fabricate a display device, because it is transparent and is manufactured with a larger surface area than that of a silicon-based substrate. Since glass and plastic substrates have a low transition temperature, a film deposition process should be performed at a low temperature of about 200° C. to about 300° C. to prevent the substrate from being deformed.

Plasma-enhanced chemical vapor deposition (PECVD) technology can be used to deposit a semiconductor and dielectric film on a large area even at a relatively low temperature, and thus, the PECVD technology is being widely used for display devices, solar cells, or the like. In the PECVD technology, an energy for dissociating a deposition source can be supplied from an electric field, not from heat, and thus, the substrate can be maintained to a relatively low temperature.

SUMMARY

According to an exemplary embodiment of the present inventive concept, a deposition apparatus includes: a chamber; a deposition source including a deposition material; a stage disposed in the chamber with a target object mounted thereon; a first plate coupled to the chamber to define a space; a second plate disposed between the first plate and the stage, wherein the second plate includes a plurality of diffusion holes provided therein; a heat dissipation member in contact with the first plate and the second plate, wherein the heat dissipation member includes a plurality of sidewall portions, wherein the plurality of sidewall portions are connected to each other to form a frame shape enclosing outer side surfaces of the first plate and the second plate; and a spacer coupled to a first sidewall portion of the plurality of sidewall portions and disposed between the first plate and the second plate, wherein the spacer extends parallel to the first sidewall portion. An extension length of the spacer is shorter than an extension length of the first sidewall portion.

In an exemplary embodiment of the present inventive concept, the spacer is disposed on a center region of the first sidewall portion.

In an exemplary embodiment of the present inventive concept, the spacer is in direct contact with the first plate and the second plate.

In an exemplary embodiment of the present inventive concept, the second plate includes first sides, opposite to each other, extending in a first direction and second sides, opposite to each other, extending in a second direction crossing the first direction, wherein the spacer is a plurality of spacers. The plurality of spacer includes: first spacers extending along the first sides and facing each other; and second spacers extending along the second sides and facing each other. An extension length of each of the second spacers is shorter than an extension length of each of the first spacers.

In an exemplary embodiment of the present inventive concept, a ratio of an extension length of each of the first spacers to a length of the first side of the second plate ranges from about 60% to about 70%.

In an exemplary embodiment of the present inventive concept, a ratio of an extension length of each of the second spacers to a length of the second side of the second plate ranges from about 20% to about 30%.

In an exemplary embodiment of the present inventive concept, the second plate includes: a diffusion part including the plurality of diffusion holes; and a peripheral part enclosing the diffusion part, wherein the spacer is disposed on the peripheral part.

In an exemplary embodiment of the present inventive concept, the heat dissipation member further includes a plurality of bottom portions, wherein each of the plurality of bottom portions is bent from a bottom end of each of the sidewall portions and is disposed below the second plate, and each of the sidewall portions includes: a first portion including an inner side surface connected to the first plate; a second portion coupled to a bottom end of the first portion and including an inner side surface coupled to the spacer; and a third portion connecting a bottom end of the second portion to the bottom portion of the heat dissipation member, wherein an inner side surface of the third portion is connected to the second plate.

In an exemplary embodiment of the present inventive concept, the spacer includes a metallic material.

In an exemplary embodiment of the present inventive concept, the spacer includes substantially a same material as that of the heat dissipation member.

In an exemplary embodiment of the present inventive concept, the second plate and the heat dissipation member are a single object.

In an exemplary embodiment of the present inventive concept, a bore penetrates the first plate, and wherein the deposition apparatus further includes a cylinder connected to the deposition source and surrounding the bore.

In an exemplary embodiment of the present inventive concept, the deposition apparatus further includes a voltage generator electrically connected to the second plate and configured to provide a voltage to the second plate to produce an electric field between the second plate and the stage.

In an exemplary embodiment of the present inventive concept, the spacer has a hexahedral shape.

In an exemplary embodiment of the present inventive concept, the spacer includes a curved surface.

In an exemplary embodiment of the present inventive concept, the spacer includes tapered ends.

According to an exemplary embodiment of the present inventive concept, a deposition apparatus includes: a chamber; a deposition source including a deposition material; a stage disposed in the chamber, wherein a target object is disposed on the stage and includes a deposition region; a first plate facing the stage and coupled to the chamber to define a space; a second plate disposed between the first plate and the stage, wherein the second plate has a rectangular shape; a heat dissipation member connected to the first plate and the second plate, wherein the heat dissipation member includes a plurality of sidewall portions that form a frame shape enclosing outer side surfaces of the first plate and the second plate; and a plurality of spacers disposed between the first plate and the second plate, wherein each of the plurality of spacers is coupled to a sidewall portion of the plurality of sidewall portions and, and each of the plurality of spacers has a rod shape extending along the plurality of sidewall portions. The second plate includes: a diffusion part overlapping the deposition region, wherein a plurality of diffusion holes are provided in the diffusion part; and a peripheral part at least partially surrounding the diffusion part. The plurality of spacers are spaced apart from each other on the peripheral part and are in direct contact with the first plate and the second plate.

In an exemplary embodiment of the present inventive concept, each of the spacers is disposed on a center region of an inner side surface of a corresponding one of the plurality of sidewall portions.

In an exemplary embodiment of the present inventive concept, the spacers include a metallic material.

According to an exemplary embodiment of the present inventive concept, a deposition apparatus includes: a chamber; a deposition source including a deposition material; a stage disposed in the chamber, wherein a target object is mounted on the stage and includes a deposition region; a first plate overlapping the stage and coupled to the chamber to define a space; a second plate disposed between the first plate and the stage, wherein the second plate includes a first side extending in a first direction and a plurality of diffusion holes overlapping the deposition region; a heat dissipation member connected to the first plate and the second plate, wherein the heat dissipation member includes a first sidewall portion extending in the first direction; and a first spacer coupled to the first sidewall portion of the heat dissipation member and disposed between the first plate and the second plate, wherein the first spacer has a rectangular shape extending in the first direction. A length of the first spacer in the first direction is shorter than a length of the first side in the first direction.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
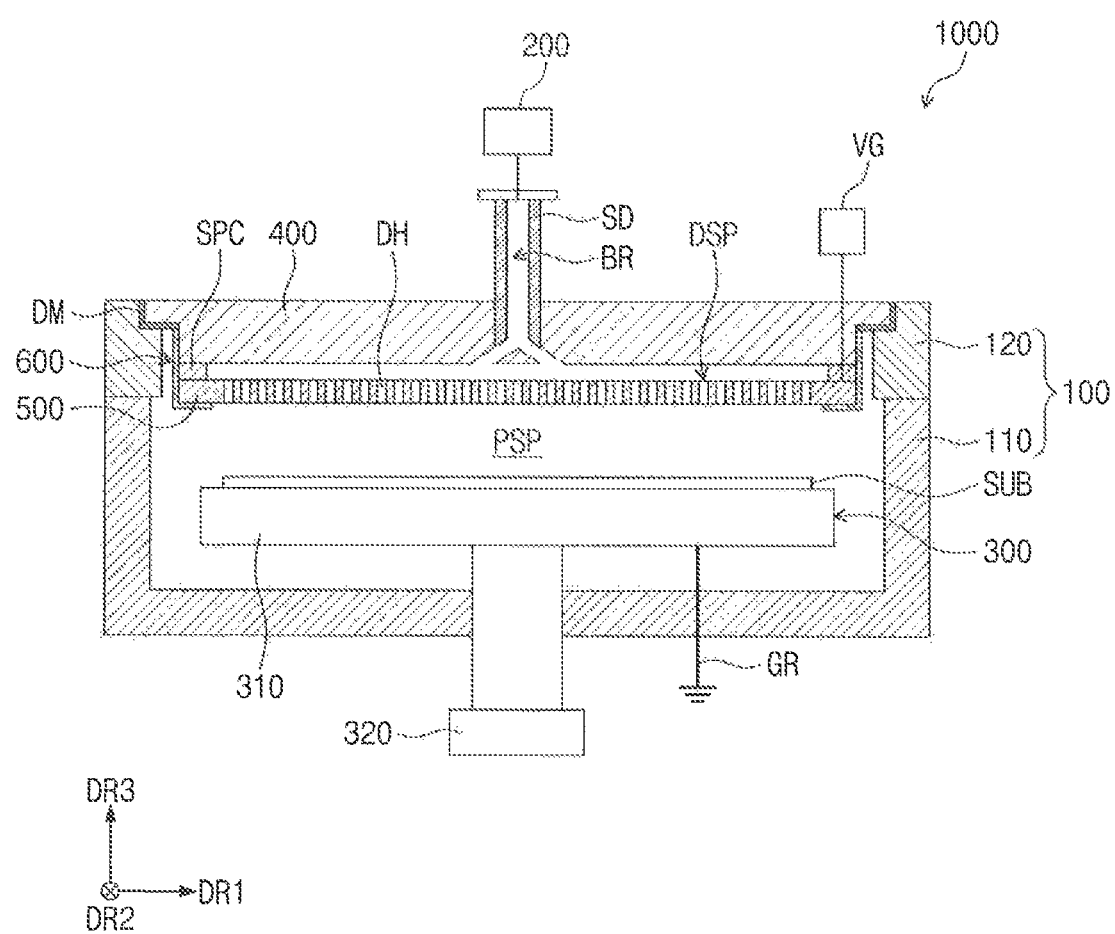
FIG. 1 is a cross-sectional view schematically illustrating a deposition apparatus according to an exemplary embodiment of the present inventive concept.

Exemplary embodiments of the present inventive concepts will now be described more fully with reference to the accompanying drawings. Exemplary embodiments of the present inventive concepts may, however, be embodied in many different forms and thus should not be construed as being limited to the exemplary embodiments set forth herein. In the drawings, thicknesses of layers and regions may be exaggerated for clarity. Like reference numerals in the drawings may denote like elements, and thus their description may be omitted.

It will be understood that when an element is referred to as being "connected" or "coupled" to another element, the element can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
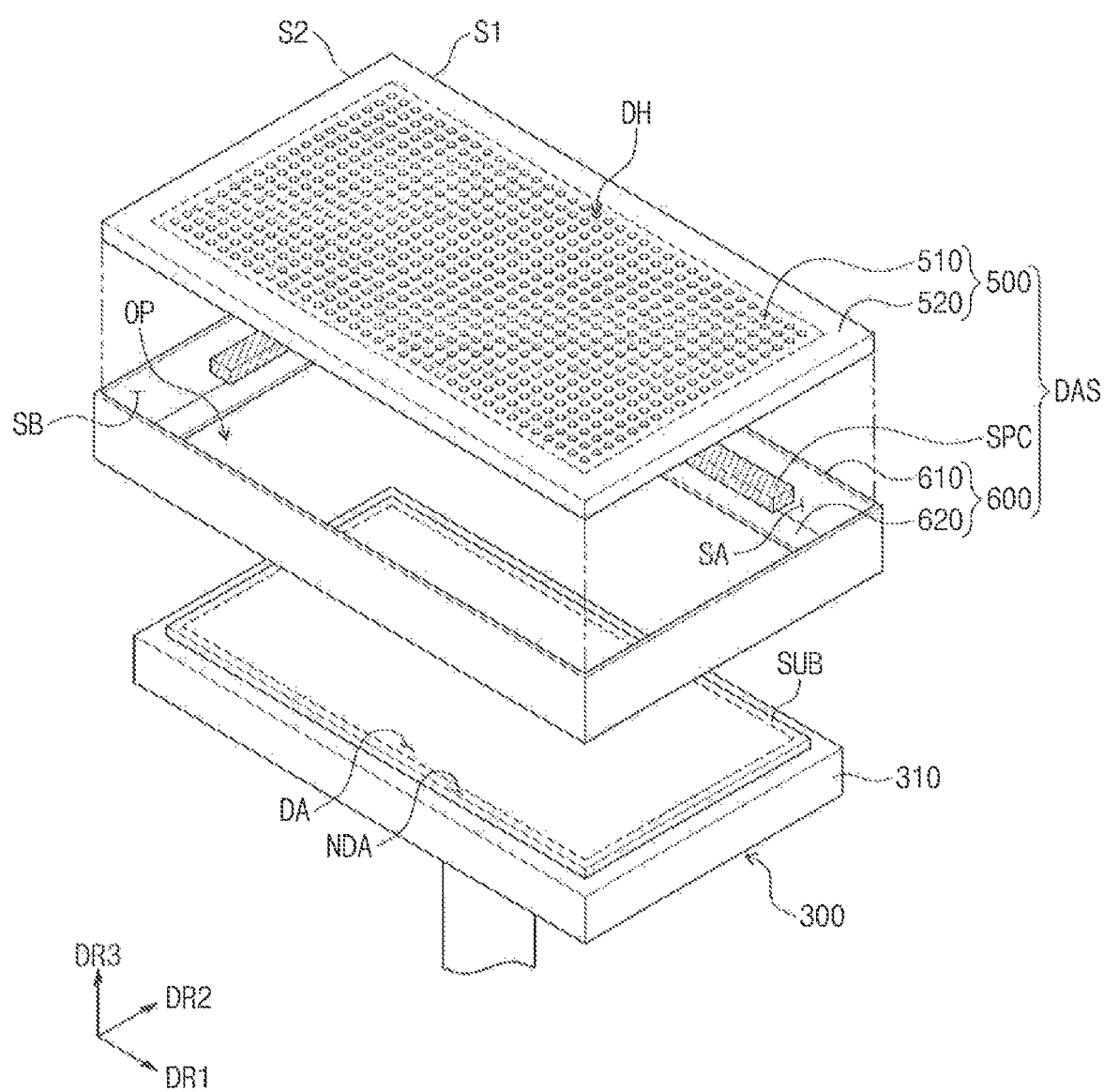
FIG. 2 is an exploded perspective view illustrating the deposition apparatus of FIG. 1 according to an exemplary embodiment of the present inventive concept.

FIG. 1 is a cross-sectional view schematically illustrating a deposition apparatus according to an exemplary embodiment of the present inventive concept, and FIG. 2 is an exploded perspective view illustrating the deposition apparatus of FIG. 1. For convenience in description and illustration, only some of the elements in FIG. 1 are illustrated in FIG. 2 according to an exemplary embodiment of the present inventive concept.

Referring to FIGS. 1 and 2, a deposition apparatus 1000 may be used to deposit a thin film on a target object SUB. As an example, the deposition apparatus 1000 according to an exemplary embodiment of the present inventive concept may be used to fabricate a liquid crystal display device or an organic light emitting display device. For example, in the present embodiment, the target object SUB may be a part of a display panel, and the thin film may be a thin amorphous silicon film of a thin film transistor included in the display panel. In addition, the present inventive concept is not limited to this example or a specific usage of the deposition apparatus 1000.

In an exemplary embodiment of the present inventive concept, the deposition apparatus 1000 may include a chamber 100, a deposition source 200, a stage 300, a first plate 400, and a diffusion structure DAS.

The chamber 100 may form an outer surface of the deposition apparatus 1000. In the present embodiment, the chamber 100 may be coupled to the first plate 400, which is a plate-shaped structure. The chamber 100 and the first plate 400 form a space, in which a deposition material is moved.

In an exemplary embodiment of the present inventive concept, the chamber 100 may include a bottom chamber 110 and a cover chamber 120.

The bottom chamber 110 may constitute a bottom surface and a sidewall of the chamber 100. For example, the bottom chamber 110 provides the bottom surface and a sidewall of the deposition apparatus 1000.

The cover chamber 120 may be disposed on the bottom chamber 110. The cover chamber 120 may have a frame shape. The cover chamber 120 may be coupled to the sidewall of the bottom chamber 110.

The first plate 400 may be mounted on the cover chamber 120. The bottom chamber 110, the cover chamber 120, and the first plate 400 may be coupled to each other to form a space, in which the deposition material is provided. The space may be maintained in a high vacuum state, and in this case, it may be possible to prevent inflow of an external contamination material and to secure a directive or anisotropic propagation of the deposition material.

In the present embodiment, the coupled structure of the chamber 100 and the first plate 400 may have a hexahedral shape, but the present inventive concept is not limited to a specific shape of the coupled structure.

In an exemplary embodiment of the present inventive concept, the cover chamber 120 may be omitted, and in this case, the first plate 400 may be mounted on the sidewall of the bottom chamber 110 and may be coupled with the chamber 100.

Furthermore, in the present embodiment, the first plate 400 may be coupled to the chamber 100 to form the outer surface of the deposition apparatus 1000, but the present inventive concept is not limited to this example. For example, the first plate 400 and the chamber 100 may form a housing. In an exemplary embodiment of the present inventive concept, the chamber 100 may be separately provided to form an isolated space, and in this case, the first plate 400 may be disposed on and fixed to the chamber 100.

The deposition source 200 may be disposed over the first plate 400. The deposition source 200 may be connected to the first plate 400 to provide the deposition material to the space formed by the chamber 100 and the first plate 400. The present inventive concept is not limited to a specific position of the deposition source 200. For example, in an exemplary embodiment of the present inventive concept, the deposition source 200 may be disposed in the chamber 100.

For example, the deposition material may be a gaseous material, when it is provided in the space formed by the chamber 100 and the first plate 400. The deposition apparatus 1000 may further include an evaporation room, which is used to evaporate a liquid deposition material.

The present inventive concept is not limited to a specific kind of the deposition material.

The stage 300 may be disposed below the first plate 400. The stage 300 may include a supporting part 310 and a moving part 320. The supporting part 310 may be disposed in the space provided by the chamber 100. For example, the supporting part 310 may be disposed adjacent to a lower portion of the space formed by the chamber 100. The supporting part 310 may have a flat plate shaped structure, whose top surface is parallel to a first direction DR1 and a second direction DR2, crossing the first direction DR1. The target object SUB may be loaded on the top surface of the supporting part 310. The top surface of the supporting part 310 may face a top portion of the chamber 100 and/or a rear surface of the first plate 400. In the present embodiment, the supporting part 310 may be grounded.

Hereinafter, a third direction DR3 is substantially perpendicular to both of the first direction DR1 and the second direction DR2. The third direction DR3 may be parallel to an upward direction and a downward direction to be described below. Furthermore, the third direction DR3 may be used as a reference direction for differentiating front and rear surfaces of each element to be described below. However, the upward and downward directions may be relative concept, and in certain embodiments, they may be used to indicate other directions.

As described above, the target object SUB may include a glass substrate or a plastic substrate, which is a part of a display panel. A deposition region DA and a non-deposition region NDA may be provided in the target object SUB, when viewed in a plan view. The deposition region DA may be provided in a center region of the target object SUB. The deposition region DA may be a region, on which the deposition material will be deposited, whereas the non-deposition region NDA may be a frame-shaped region, at least partially, enclosing the deposition region DA, when viewed in a plan view. The deposition material might not be deposited on the non-deposition region NDA. For example, the deposition apparatus 1000 may further include a mask, which may cover the non-deposition region NDA and a predetermined region of the deposition region DA. The deposition material might not be deposited on the regions covered with the mask. In an exemplary embodiment of the present inventive concept, the non-deposition region NDA may be omitted.

The moving part 320 may be connected to the supporting part 310. The moving part 320 may be configured to change a position of the supporting part 310. In the case where the supporting part 310 is reciprocally moved in only the third direction DR3, the moving part 320 may be disposed inside or outside the chamber 100 without constraint in position. In addition, in the case where the supporting part 310 is moved within a plane provided by the first direction DR1 and the second direction DR2, the moving part 320, along with the supporting part 310, may be disposed within the chamber 100. FIG. 1 illustrates an example, in which the moving part 320 is disposed outside the chamber 100; however, the present inventive concept is not limited thereto.

As described above, the first plate 400 may be a plate-shaped structure. The first plate 400 may be mounted on the cover chamber 120 to form a space between the chamber 100 and the first plate 400.

In the present embodiment, a bore BR may be formed in the first plate 400 to penetrate the first plate 400. The bore BR may be used as a pathway, through which the deposition material including the deposition source 200 can be moved. In an exemplary embodiment of the present inventive concept, the deposition apparatus 1000 may further include a cylinder SD, which is connected to the deposition source 200, and in this case, the bore BR may be disposed in the cylinder SD. The cylinder SD may penetrate the first plate 400.

A plurality of distribution holes may be formed in the first plate 400. Each of the distribution holes may be an empty space diverging from the cylinder SD. The distribution holes may be used to diffuse the deposition material, which is provided from the deposition source 200, in a more effective manner.

The diffusion structure DAS may be disposed below the first plate 400. The diffusion structure DAS may be coupled with the first plate 400 to provide a diffusion space DSP. In the case where the deposition material is supplied from the deposition source 200 into the chamber 100, the deposition material may be diffused in the diffusion space DSP.

The diffusion structure DAS may include a second plate 500, a heat dissipation member 600, and a spacer SPC.

The second plate 500 may be disposed below the first plate 400 and may be spaced apart from the first plate 400. The second plate 500 may be overlapped with the first plate 400, when viewed in a plan view. For example, the second plate 500 may include a metallic material. As an example, the second plate 500 may include aluminum (Al).

For example, the second plate 500 may have a plate shape. As an example, the second plate 500 may have a first side S1 parallel to the first direction DR1 and a second side S2 parallel to the second direction DR2. A length of the first side S1 may be longer than a length of the second side S2.

The second plate 500 may include a diffusion part 510 and a peripheral part 520. The diffusion part 510 may be provided in a center region of the second plate 500, when viewed in a plan view. In the present embodiment, a plurality of diffusion holes DH may be provided in the diffusion part 510 to penetrate the second plate 500 in the third direction DR3. The diffusion holes DH may be overlapped with the deposition region DA of the target object SUB, when viewed in a plan view. The diffusion holes DH may be arranged in a matrix shape, when viewed in a plan view. The present inventive concept is not limited to the number, size or arrangement of the diffusion holes DH.

In the case where a deposition material is provided in the diffusion space DSP, the deposition material may be diffused in the diffusion space DSP and may be moved to a region below the diffusion structure DAS through the diffusion holes DH.

The heat dissipation member 600 may have a frame shape extending along a side surface of the second plate 500. For example, the second plate 500 may be disposed in the heat dissipation member 600, and the heat dissipation member 600 may surround the second plate 500. The heat dissipation member 600 may connect the first plate 400 to the second plate 500.

The deposition apparatus 1000 may further include a connection member connecting the heat dissipation member 600 to the first plate 400 and the second plate 500. The present inventive concept is not limited to a specific kind of the connection member. As an example, the connection member may include a tape, a screw, a nail, or the like.

The heat dissipation member 600 may have inner side surfaces SA and SB that are in contact with the side surface of the first plate 400 and the side surface of the second plate 500. For example, the first plate 400 may be disposed in the heat dissipation member 600 and may be disposed on the second plate 500. The heat dissipation member 600 may include a thermally conductive material. As an example, the heat dissipation member 600 may include a metallic material (e.g., aluminum).

The spacer SPC may be disposed between the first plate 400 and the second plate 500. For example, a top surface of the spacer SPC may be in direct contact with a bottom surface of the first plate 400, and a bottom surface of the spacer SPC may be in direct contact with a top surface of the second plate 500. For example, a height of the spacer SPC (see, e.g., FIG. 3) may be substantially equal to a distance between the first plate 400 and the second plate 500, when measured in the third direction DR3.

The spacer SPC may be coupled with the heat dissipation member 600. The spacer SPC may be configured to exhaust heat, which is provided to the second plate 500, to the outside. The spacer SPC may include a thermally conductive material. As an example, the spacer SPC may be formed of or include substantially the same material as that of the heat dissipation member 600. For example, the spacer SPC may include a metallic material (e.g., aluminum). However, the present inventive concept is not limited thereto.

In the present embodiment, a plurality of the spacers SPC may be provided. However, the present inventive concept is not limited to the number of the spacer SPC.

The heat dissipation member 600 and the spacers SPC will be described in more detail with reference to FIG. 5.

According to an exemplary embodiment of the present inventive concept, the deposition apparatus 1000 may be a plasma chemical vapor deposition apparatus, which is configured to perform a plasma-enhanced chemical vapor deposition (PECVD) process.

For example, the deposition apparatus 1000 may further include a voltage generator VG. The voltage generator VG may be electrically connected to the diffusion structure DAS. The voltage generator VG may apply a voltage to the second plate 500 of the diffusion structure DAS. As an example, the voltage applied to the second plate 500 may be an AC voltage.

In the present embodiment, an electric field may be produced in a plasma space PSP, which is an empty space formed between the diffusion structure DAS and the stage 300. The electric field may produce plasma from a deposition material, which is provided into the plasma space PSP through the diffusion holes DH of the second plate 500. In the case where the plasma of the deposition material is used to perform a deposition process, the deposition material may be deposited at a relatively low temperature.

In the present embodiment, the deposition apparatus 1000 may further include an insulating member DM. The insulating member DM may be disposed between the first plate 400 and the cover chamber 120 to electrically disconnect the first plate 400 from the chamber 100. For example, the first plate 400 may be insulated from the chamber 100. Thus, the first plate 400, which is electrically connected to the second plate 500 by the heat dissipation member 600 and the spacers SPC, might not be electrically connected to the cover chamber 120.

In an exemplary embodiment of the present inventive concept, in the case where at least one of the heat dissipation member 600 and the second plate 500 is in contact with the chamber 100, the insulating member DM may be additionally disposed between the heat dissipation member 600 and the chamber 100 or between the second plate 500 and the chamber 100.

Figure 3:
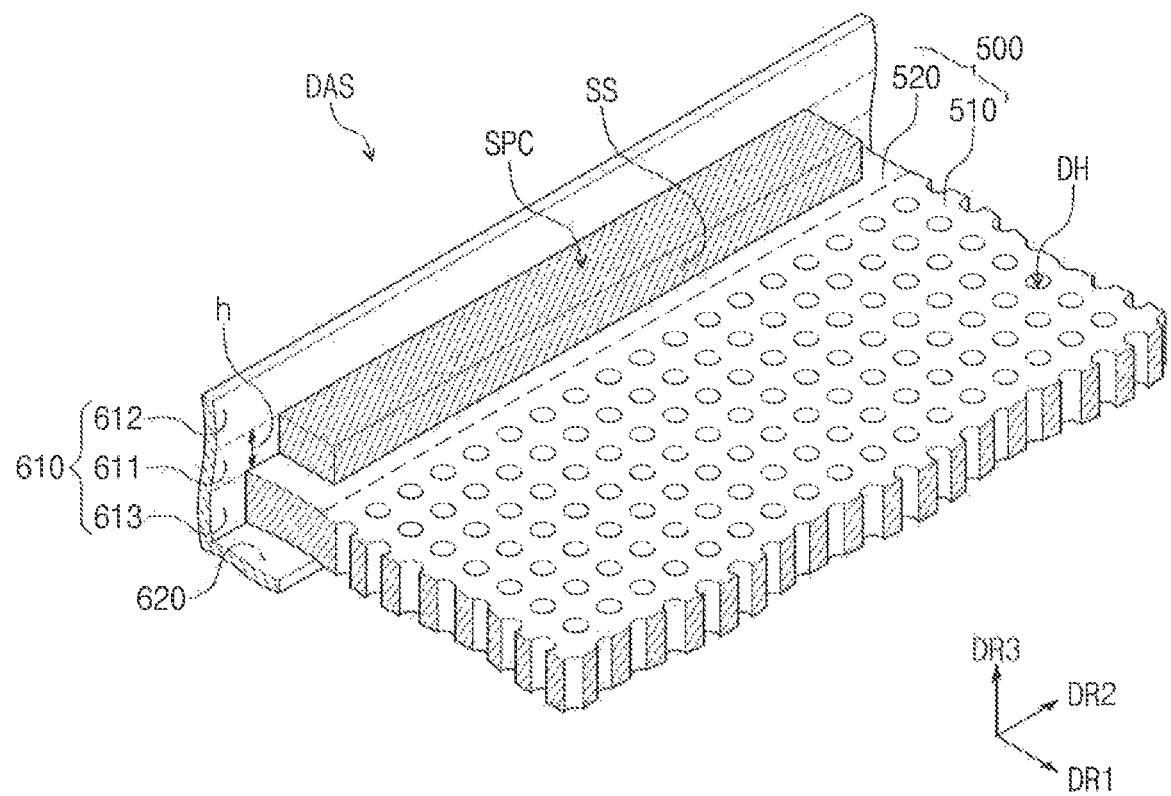
FIG. 3 is an enlarged perspective view illustrating a spacer shown in FIG. 2 according to an exemplary embodiment of the present inventive concept.

FIG. 3 is an enlarged perspective view illustrating one of the spacers shown in FIG. 2 according to an exemplary embodiment of the present inventive concept. For convenience in description, FIG. 3 illustrates, as an example, a region provided with one spacer of the plurality of spacers.

Figure 4:
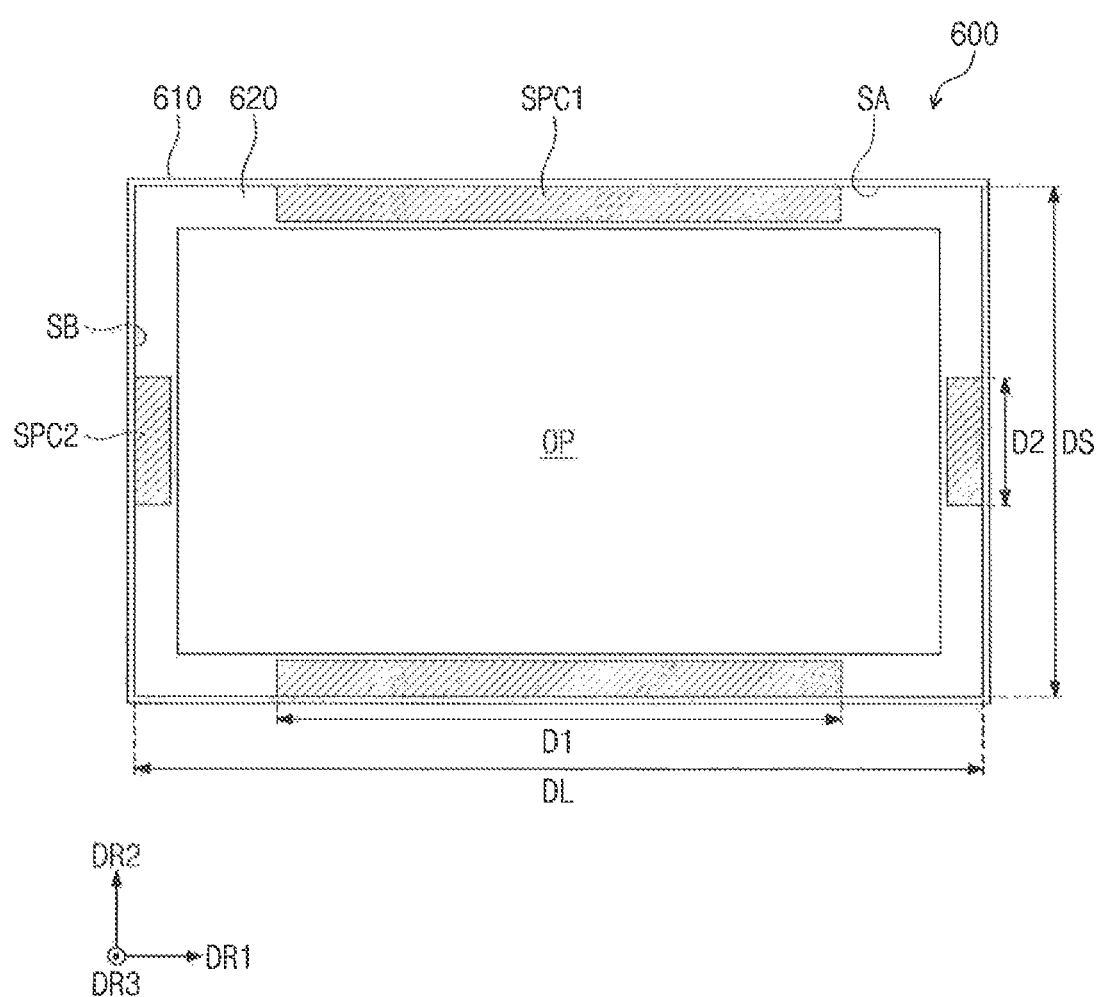
FIG. 4 is a top plan view of a heat dissipation member and spacers shown in FIG. 1 according to an exemplary embodiment of the present inventive concept.
Figure 5:
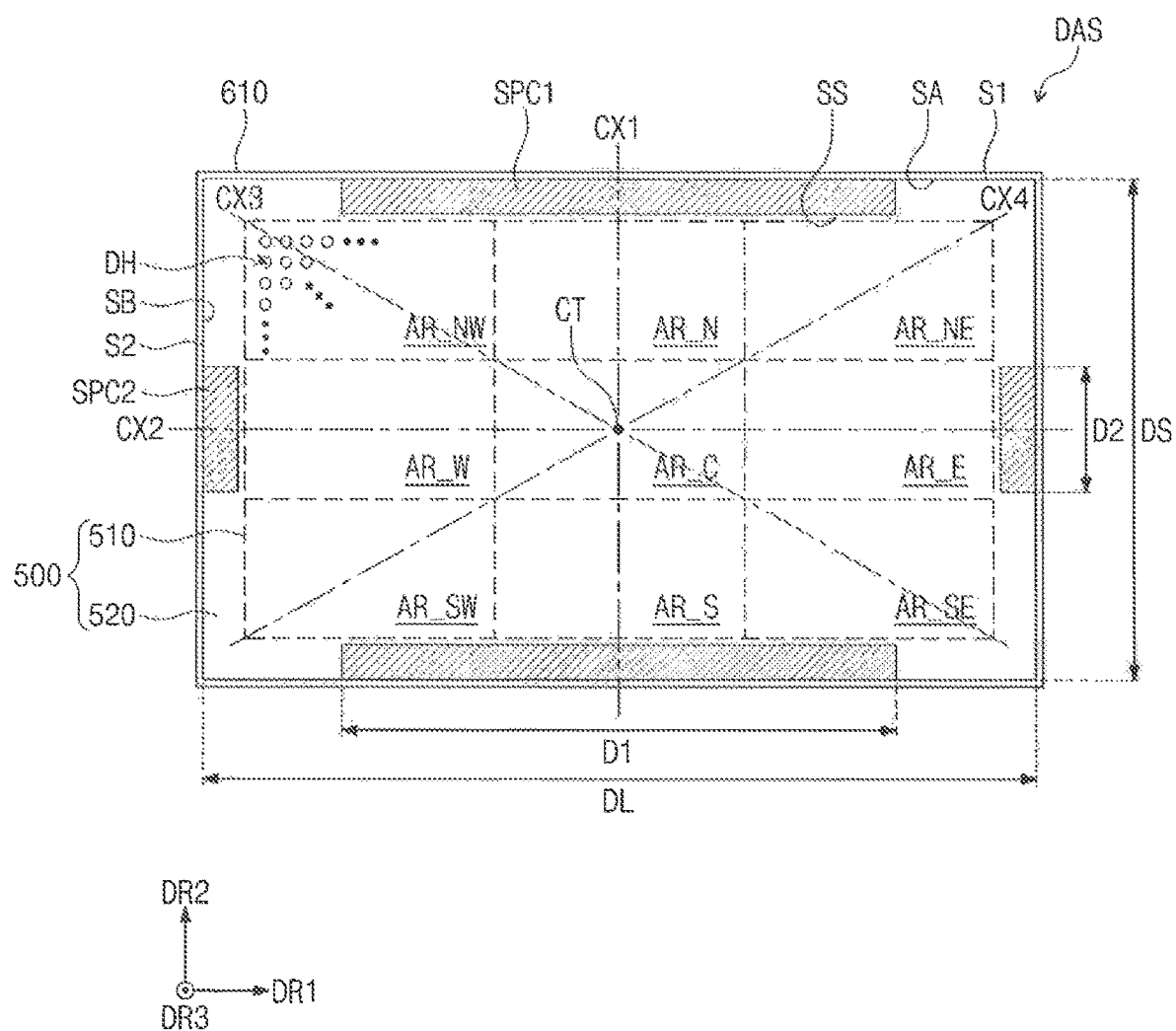
FIG. 5 is a diagram illustrating a second plate mounted on the heat dissipation member according to an exemplary embodiment of the present inventive concept.

FIG. 4 is a top plan view of the heat dissipation member and the spacers shown in FIG. 1 according to an exemplary embodiment of the present inventive concept, and FIG. 5 is a diagram illustrating the second plate mounted on the heat dissipation member according to an exemplary embodiment of the present inventive concept.

Referring to FIGS. 3 to 5 in conjunction with FIG. 2, the heat dissipation member 600 may include a plurality of sidewall portions 610 and a plurality of bottom portions 620.

The sidewall portions 610 may be connected to each other to form a frame shape, when viewed in a plan view. For example, the sidewall portions 610 may form a rectangular frame. The sidewall portions 610 may be extended along the first sides S1 and the second sides S2 of the second plate 500, when viewed in a plan view. The number of the sidewall portions 610 may correspond to the number of the sides constituting the second plate 500.

Each of the sidewall portions 610 may include a first portion 611, a second portion 612, and a third portion 613. Each of the first portion 611, the second portion 612 and the third portion 613 may be extended to be parallel to a corresponding one of the sides S1 and S2 of the second plate 500.

An inner side surface of the first portion 611 may be coupled to the spacer SPC. The second portion 612 may be connected to a top end of the first portion 611. An inner side surface of the second portion 612 may be in contact with the first plate 400. For example, an inner side surface of the second portion 612 may be connected to the first plate 400. The third portion 613 may be disposed under a bottom end of the first portion 611 to connect the first portion 611 to the bottom portion 620. An inner side surface of the third portion 613 may be in contact with the second plate 500. For example, an inner side surface of the third portion 613 may be connected to the second plate 500.

The bottom portions 620 may be connected to the sidewall portions 610. For example, the number of bottom portions 620 may correspond to the number of sidewall portions 610. The bottom portions 620 may be connected to each other to form a frame shape, when viewed in a plan view. For example, the heat dissipation member 600 may have an opening OP provided in a center region thereof, when viewed in a plan view.

Each of the bottom portions 620 may be bent from a bottom end of each of the sidewall portions 610. For example, each of the bottom portions 620 may be bent from a bottom end of the third portion 613 to be parallel the plane formed by the first and second directions DR1 and DR2 and may be disposed below the second plate 500. When viewed in a plan view, the bottom portions 620 may be overlapped with the peripheral part 520 of the second plate 500. For example, the peripheral part 520, which is an edge region of the second plate 500, may be mounted on the bottom portion 620. In an exemplary embodiment of the present inventive concept, the bottom portion 620 may be omitted.

The spacers SPC may be overlapped with the peripheral part 520 of the second plate 500, when viewed in a plan view. In the present embodiment, the spacers SPC might not be overlapped with the diffusion part 510 of the second plate 500.

The spacers SPC may have a rod-shaped structure extending along the peripheral part 520, when viewed in a plan view. As an example, the spacers SPC may have a hexahedral shape.

The spacers SPC may include first spacers SPC1 and second spacers SPC2. The first spacers SPC1 and the second spacers SPC2 may be spaced apart from each other.

The first spacers SPC may face each other in the second direction DR2. Each of the first spacers SPC1 may be disposed adjacent to the first side S1 of the second plate 500. Each of the first spacers SPC1 may extend along the first side S1. For example, the first spacers SPC1 may extend along the long sides of the heat dissipation member 600.

The second spacers SPC2 may face each other in the first direction DR. Each of the second spacers SPC2 may be disposed adjacent to the second side S2 of the second plate 500. Each of the second spacers SPC2 may extend along the second side S2. For example, an extension length of each of the second spacers SPC2 may be shorter than an extension length of each of the first spacers SPC1. For example, the second spacers SPC2 may extend along the short sides of the heat dissipation member 600.

According to an exemplary embodiment of the present inventive concept, an extension length of the first spacer SPC1 may be shorter than a length of the first side S1. For example, the extension length of the first spacer SPC1 may be shorter than an extension length, in the first direction DR1, of one of the sidewall portions 610 of the heat dissipation member 600 coupled to the first spacer SPC1. As an example, a ratio of an extension length D1 of the first spacer SPC1 to a length DL of the first side S1 may range from about 60% to about 70%.

Furthermore, an extension length of the second spacer SPC2 may be shorter than a length of the second side S2. For example, the extension length of the second spacer SPC2 may be shorter than an extension length, in the second direction DR2, of one of the sidewall portions 610 of the heat dissipation member 600 coupled to the second spacer SPC2. As an example, a ratio of an extension length D2 of the second spacer SPC2 to a length DS of the second side S2 may range from about 20% to about 30%.

According to an exemplary embodiment of the present inventive concept, each of the spacers SPC1 and SPC2 may be disposed on a center region of the inner side surface SA or SB of each of the sidewall portions 610 connected to the spacers SPC1 and SPC2. For example, each of the first spacers SPC1 may be disposed on the peripheral part 520 to be overlapped with a central area of the first side S1. Each of the second spacers SPC2 may be disposed on the peripheral part 520 to be overlapped with a central area of the second side S2.

As shown in FIG. 5, the diffusion part 510 of the second plate 500 may be divided into a plurality of regions, when viewed in a plan view.

A center region AR_C may be provided at a center region of the diffusion part 510, when viewed in a plan view. A center point CT, which is located at a center of the diffusion part 510, may be disposed in the center region AR_C, when viewed in a plan view. Each of first peripheral regions AR_E, AR_W, AR_S, and AR_N may be disposed between the center region AR_C and the sides S1 and S2 of the second plate 500. The first peripheral regions AR_E, AR_W, AR_S, and AR_N may be spaced apart from each other. Each of second peripheral regions AR_SE, AR_SW, AR_NE, and AR_NW may be disposed between adjacent first peripheral regions AR_E, AR_W, AR_S, and AR_N. The second peripheral regions AR_SE, AR_SW, AR_NE, and AR_NW may be located adjacent to vertices of the second plate 500, when viewed in a plan view.

In the case where, unlike exemplary embodiments of present the inventive concept, the deposition apparatus 1000 does not include the spacers SPC, due to plasma heat generated in the plasma space PSP (see, e.g., FIG. 1), temperature of the center region AR_C of the second plate 500 may be relatively higher than temperature of each of the first peripheral regions AR_E, AR_W, AR_S, and AR_N and the second peripheral regions AR_SE, AR_SW, AR_NE, and AR_NW in a plan view. If there is a spatial variation in internal temperature of the diffusion space DSP (see, e.g., FIG. 1), the kinetic energy of the deposition material may vary from region to region, and this may lead to non-uniform diffusion of the deposition material. As an example, if the center region AR_C has a relatively high temperature, a mass density of the deposition material may be smaller in the center region AR_C than in the first peripheral regions AR_E, AR_W, AR_S, and AR_N and the second peripheral regions AR_SE, AR_SW, AR_NE, and AR_NW. In addition, according to an exemplary embodiment of the present inventive concept, the spacers SPC1 and SPC2 may overlap the peripheral part 520 of the second plate 500 and thus may be used to exhaust plasma heat, which is transferred to the second plate 500, to the outside. For example, by disposing the spacers SPC1 and SPC2 on the peripheral part 520, which is not overlapped with the diffusion part 510, in addition to the heat dissipation member 600, it may be possible to increase the heat-dissipation efficiency of the deposition apparatus 1000.

Figure 6A:
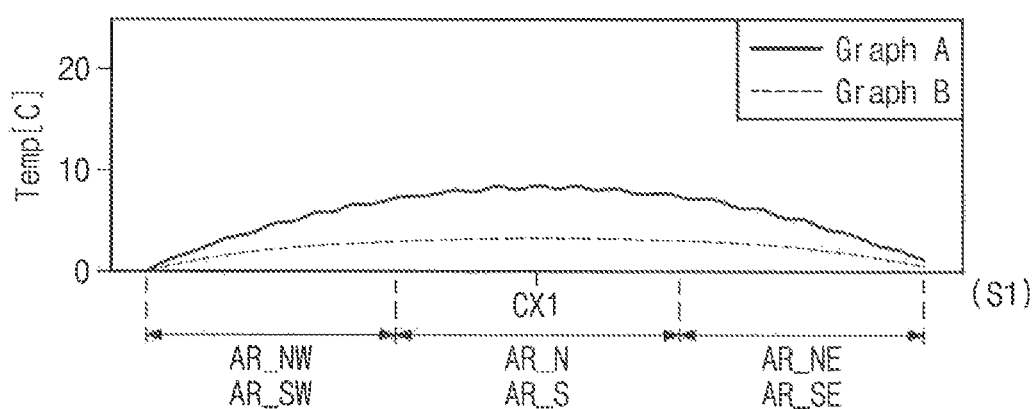
FIGS. 6A, 6B and 6C are graphs showing a spatial variation in temperature of a second plate, according to an exemplary embodiment of the present inventive concept.
Figure 6B:
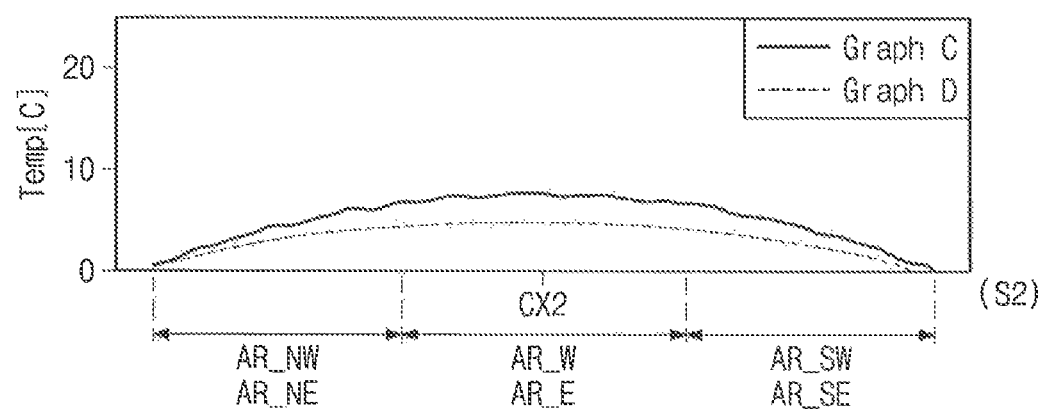
Figure 6C:
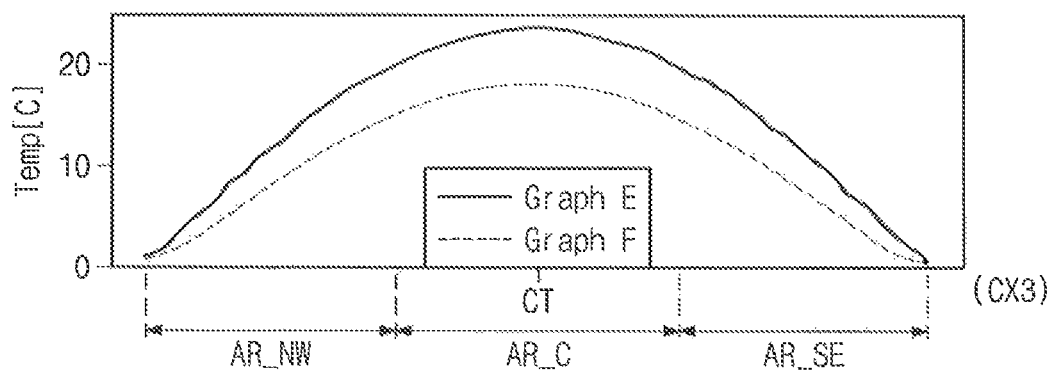

FIGS. 6A to 6C are graphs each showing a positional variation in temperature of the second plate, according to an exemplary embodiment of the present inventive concept.

Hereinafter, for convenience in description, an imaginary line passing through the center point CT in the second direction DR2 will be referred to as a first center line CX1, and an imaginary line passing through the center point CT in the first direction DR1 will be referred to as a second center line CX2. In addition, imaginary lines, which are extended in a diagonal direction to connect opposite vertices of the diffusion part 510 and to pass through the center point CT, will be referred to as a third center line CX3 and a fourth center line CX4.

FIG. 6A is a graph showing a variation in temperature of the diffusion part 510, based on regions of the diffusion part 510, in a direction parallel to the first side S1, and FIG. 6B is a graph showing a variation in temperature of the diffusion part 510, based on regions of the diffusion part 510, in a direction parallel to the second side S2. FIG. 6C is a graph showing a variation in temperature of the diffusion part 510, based on regions of the diffusion part 510, in a direction parallel to the third center line CX3. A variation in temperature of the diffusion part 510, based on regions of the diffusion part 510, in a direction parallel to the fourth center line CX4 is substantially the same as that of the graph illustrate in FIG. 6C, and a detailed description thereof may be omitted. The graphs B, D, and F show temperature variations according to an exemplary embodiment of the present inventive concept, whereas the graphs A, C, and E show temperature variations according to a comparative example.

Referring to FIGS. 6A to 6C, the first peripheral regions AR_E, AR_W, AR_S, and AR_N may have temperatures relatively higher than the second peripheral regions AR_SE, AR_SW, AR_NE, and AR_NW. For example, the temperatures of the second peripheral regions AR_SE, AR_SW, AR_NE, and AR_NW may be lower than other regions. As described above, each of the spacers SPC1 and SPC2 according to an exemplary embodiment of the present inventive concept may be disposed at a central area of each side (e.g., S1 and S2) of peripheral part 520 extending in each direction (e.g., DR1 and DR2). For example, according to an exemplary embodiment of the present inventive concept, the spacers SPC1 and SPC2 may be disposed adjacent to the first peripheral regions AR_E, AR_W, AR_S, and AR_N. This may make it possible to more effectively increase the heat-dissipation efficiency of the spacers SPC1 and SPC2. In addition, the first spacers SPC1 may partially overlap the second peripheral regions AR_SE, AR_SW, AR_NE, and AR_NW and the second spacers SPC2 might not overlap the second peripheral regions AR_SE, AR_SW, AR_NE, and AR_NW; however the present inventive concept is not limited thereto. For example, the spacers SPC1 and SPC2 might not be adjacent to the second peripheral regions AR_SE, AR_SW, AR_NE, and AR_NW having the relatively low temperatures. According to an exemplary embodiment of the present inventive concept, when compared with the comparative example, the spatial variation in temperature of the second plate 500 may be relatively reduced, as shown in the graphs B, D, and F of FIGS. 6A to 6C.

Consequently, according to an exemplary embodiment of the present inventive concept, it may be possible to increase deposition uniformity of the deposition apparatus 1000.

Figure 7:
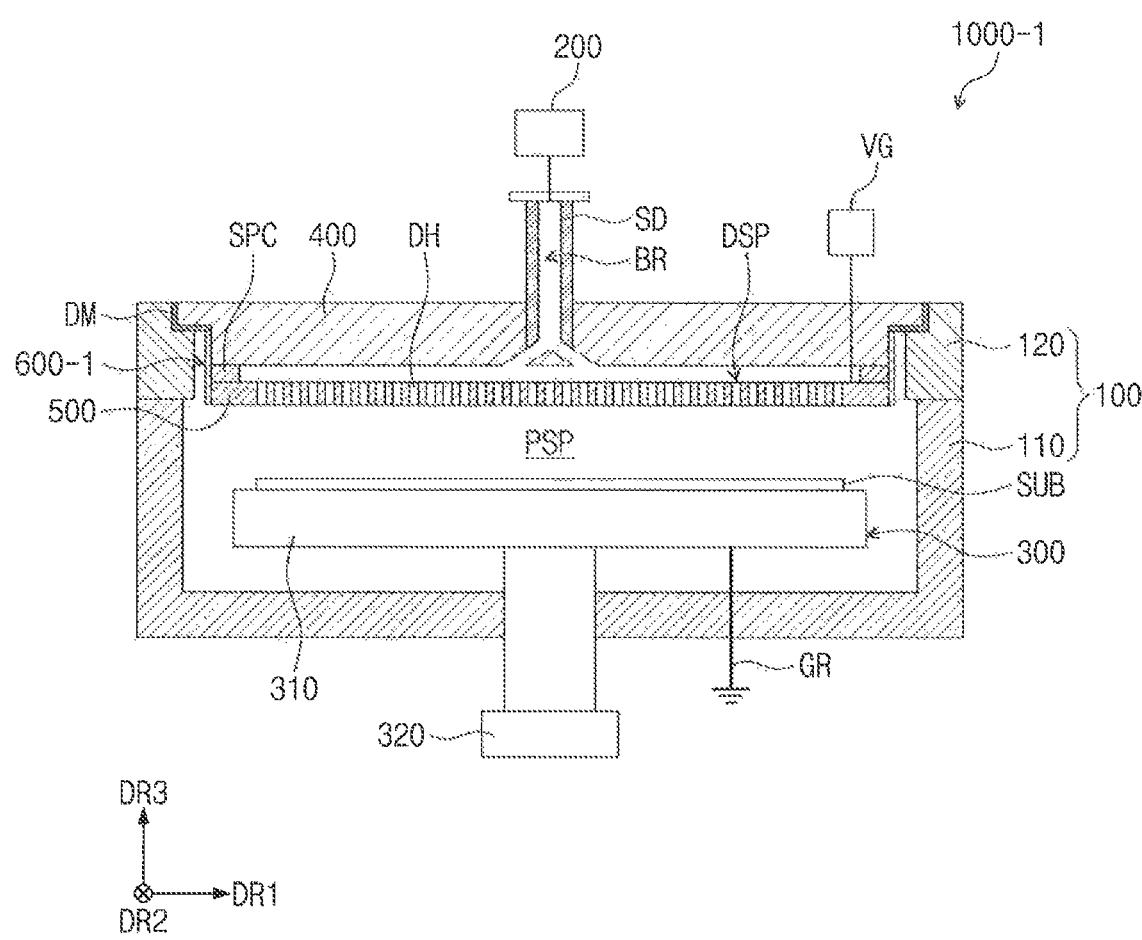
FIG. 7 is a cross-sectional view illustrating a deposition apparatus according to an exemplary embodiment of the present inventive concept.
Figure 8:
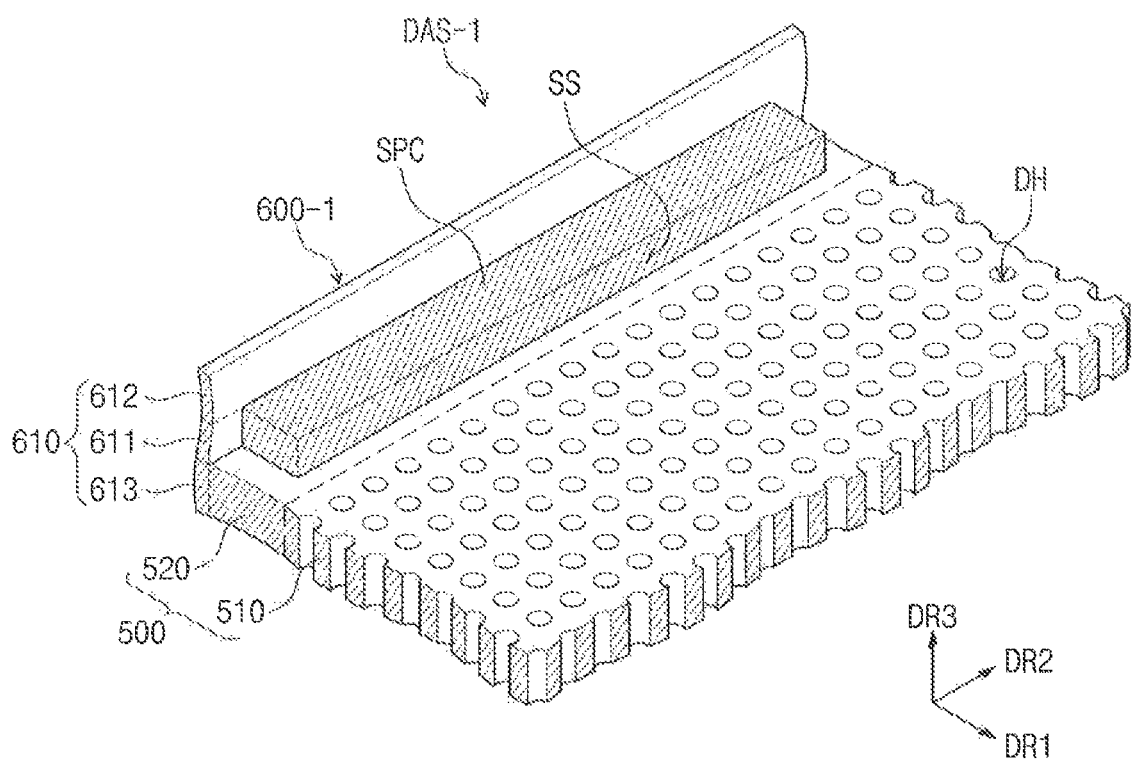
FIG. 8 is an enlarged perspective view illustrating a region of a diffusion structure shown in FIG. 7 according to an exemplary embodiment of the present inventive concept.

FIG. 7 is a cross-sectional view illustrating a deposition apparatus according to an exemplary embodiment of the present inventive concept, and FIG. 8 is an enlarged perspective view illustrating a region of the diffusion structure shown in FIG. 7 according to an exemplary embodiment of the present inventive concept.

To reduce complexity in the drawings and to provide better understanding of the present inventive concept, some elements of a deposition apparatus, which may be considered the same or substantially similar to elements previously discussed, may be omitted. For concise description, a previously described element may be identified by a similar or identical reference number without repeating an overlapping description thereof.

Referring to FIGS. 7 and 8, the second plate 500 and a heat dissipation member 600-1 may be provided to constitute a single object or body. In this case, a connection member connecting the bottom portion 620 and the second plate 500 to the heat dissipation member 600-1 may be omitted.

For example, the second plate 500 and a heat dissipation member 600-1 may be formed at the same time. In other words, the second plate 500 and the heat dissipation member 500-1 may include substantially the same material. As an example, the second plate 500 and the heat dissipation member 500-1 may include a metallic material.

Figure 9:
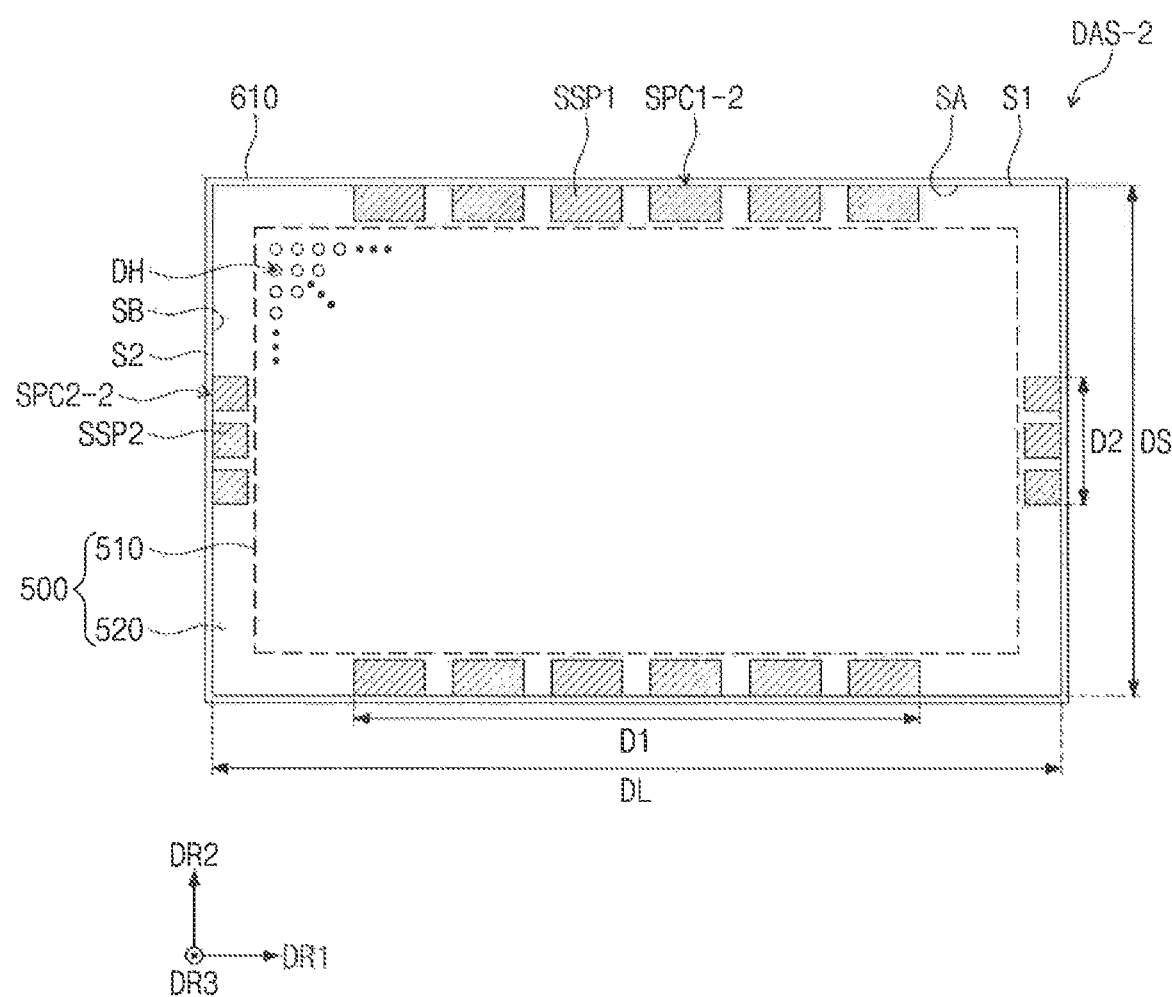
FIG. 9 is a top plan view illustrating a diffusion structure according to an exemplary embodiment of the present inventive concept.

FIG. 9 is a top plan view illustrating a diffusion structure according to an exemplary embodiment of the present inventive concept.

To reduce complexity in the drawings and to provide better understanding of the present inventive concept, some elements of a deposition apparatus, which may be considered the same or substantially similar to elements previously discussed, may be omitted. For concise description, a previously described element may be identified by a similar or identical reference number without repeating an overlapping description thereof.

Referring to FIG. 9, each of the spacers SPC1 and SPC2 may include a plurality of sub spacers SSP1 and SSP2.

For example, each of the first spacers SPC1-2 may include a plurality of first sub spacers SSP1. The first sub spacers SSP1 may be arranged on the peripheral part 520 and in the first direction DR1. The first sub spacers SSP1 may be spaced apart from each other. A length D1, in the first direction DR1, of a region of the peripheral part 520 provided with the first sub spacers SSP1 may be shorter than the length DL of the first side S1.

Each of the second spacers SPC2-2 may include a plurality of second sub spacers SSP2. The second sub spacers SSP2 may be arranged on the peripheral part 520 in the second direction DR2. The second sub spacers SSP2 may be spaced apart from each other. A length D2, in the second direction DR2, of a region of the peripheral part 520 provided with the second sub spacers SSP2 may be shorter than the length DS of the second side S2.

Figure 10:
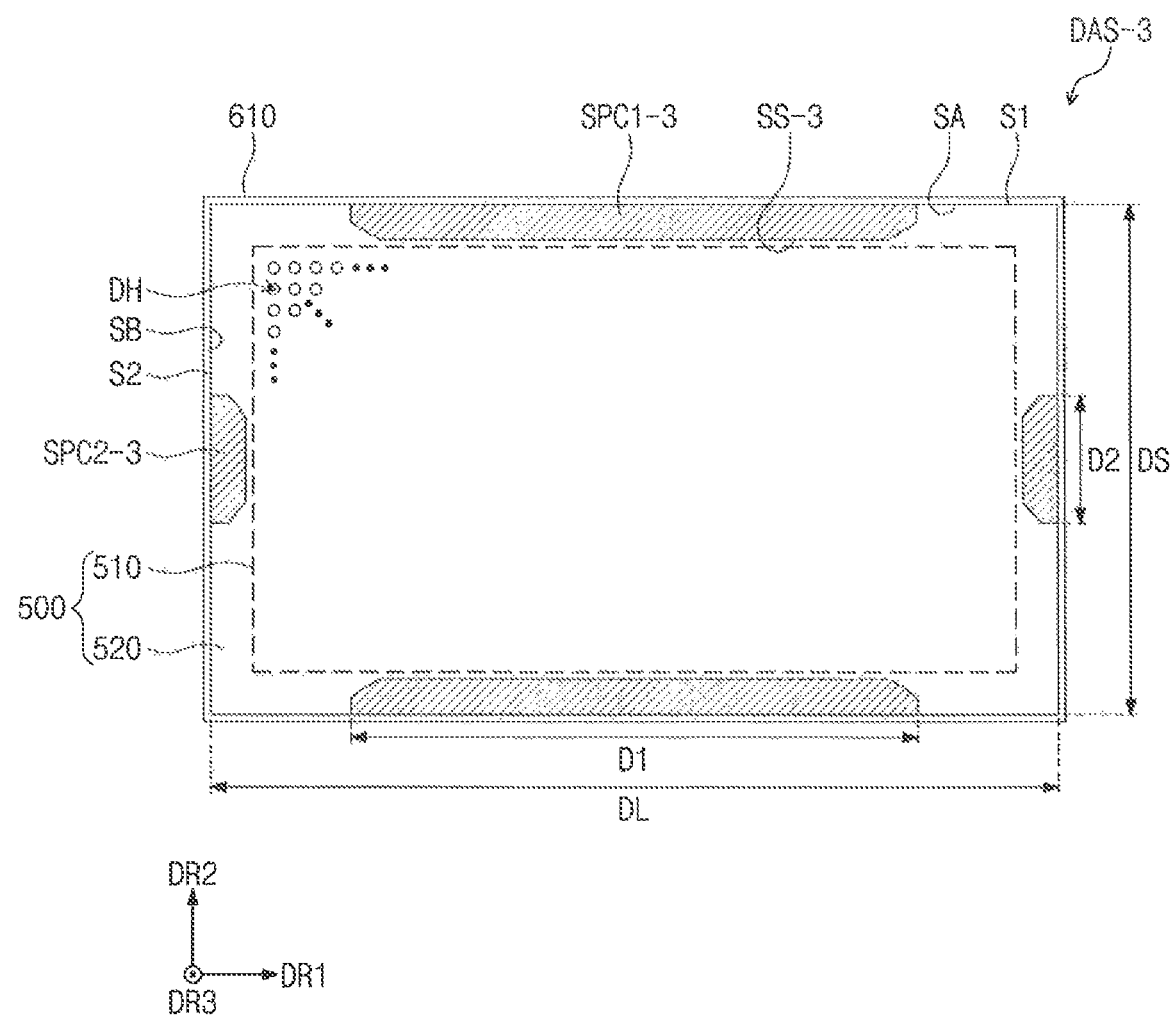
FIG. 10 is a top plan view illustrating a diffusion structure according to an exemplary embodiment of the present inventive concept.
Figure 11:
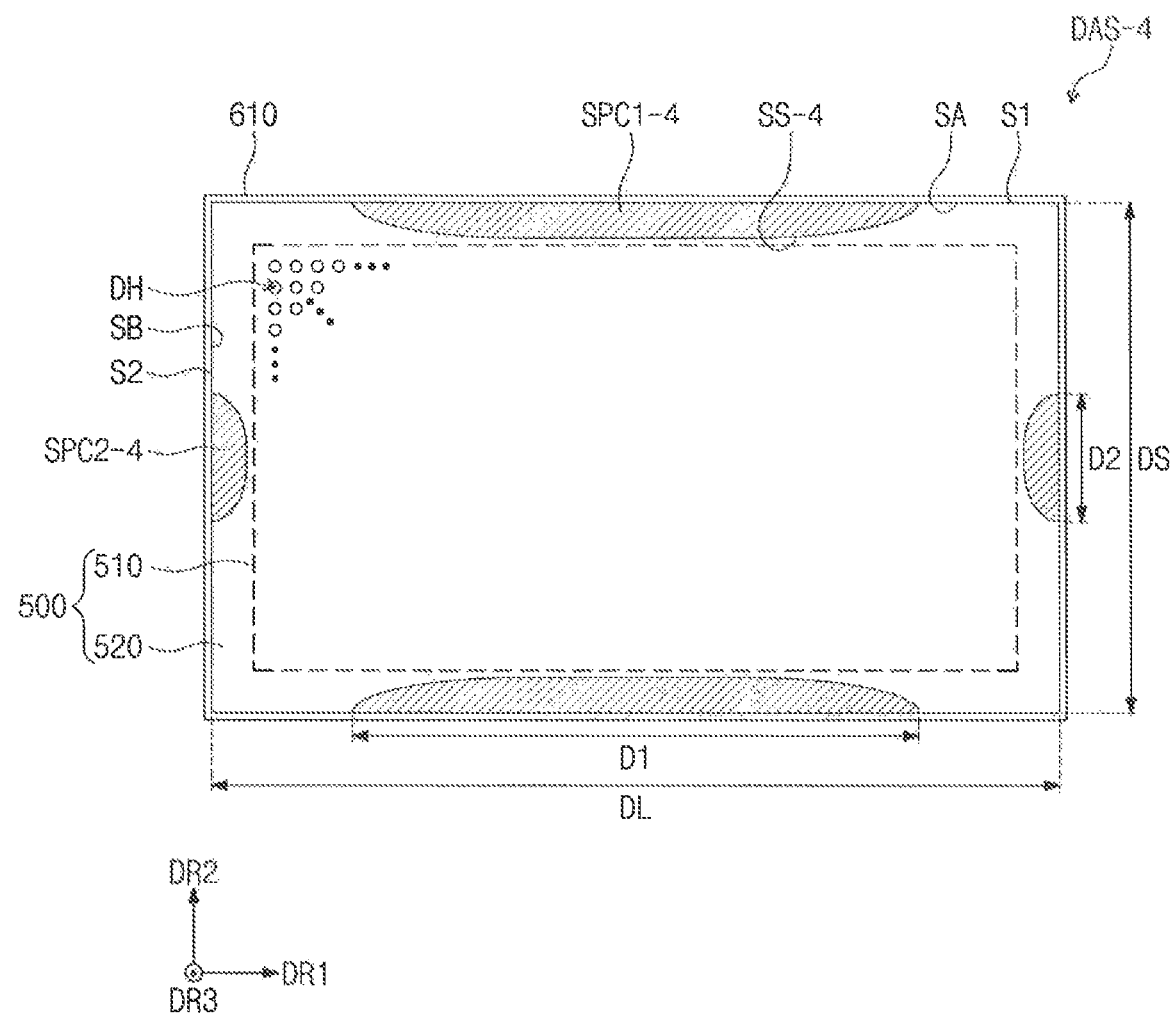
FIG. 11 is a top plan view illustrating a diffusion structure according to an exemplary embodiment of the present inventive concept.

FIGS. 10 and 11 are top plan views illustrating diffusion structures according to exemplary embodiments of the present inventive concept.

To reduce complexity in the drawings and to provide better understanding of the present inventive concept, some elements of a deposition apparatus, which may be considered the same or substantially similar to elements previously discussed, may be omitted. For concise description, a previously described element may be identified by a similar or identical reference number without repeating an overlapping description thereof.

Referring to FIGS. 10 and 11, each of the spacers SPC1 and SPC2 according to an exemplary embodiment of the present inventive concept may have a relatively reduced width at its opposite ends in its extension direction, from a plan view. For example, the width, in the second direction DR2, of each of the first spacers SPC1 may be smaller at its opposite ends in the first direction DR1 than at its central area. The width, in the first direction DR1, of each of the second spacers SPC2 may be smaller at its opposite ends in the second direction DR2 than at its central area.

As an example, as shown in FIG. 10, a side surface SS-3 of each of the spacers SPC1-3 and SPC2-3 may have a chamfered shape, when viewed in a plan view. For example, each of the spacers SPC1-3 and SPC2-3 may have a hexagonal shape or another polygonal shape.

Furthermore, as shown in FIG. 11, a side surface SS-4 of each of the spacers SPC1-4 and SPC2-4 may have a curved surface. For example, the side surface SS-4 may have a shape that is convex toward the diffusion part 510, when viewed in a plan view.

According to an exemplary embodiment of the present inventive concept, the uniformity of the film deposited through the deposition apparatus can be increased by increasing the deposition uniformity in the deposition process.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A deposition apparatus, comprising:
a chamber;
a deposition source including a deposition material;
a stage disposed in the chamber with a target object mounted thereon;
a first plate coupled to the chamber to define a space;
a second plate disposed between the first plate and the stage, wherein the second plate includes a plurality of diffusion holes provided therein;
a heat dissipation member in contact with the first plate and the second plate, wherein the heat dissipation member includes a plurality of sidewall portions, wherein the plurality of sidewall portions are connected to each other to form a frame shape enclosing outer side surfaces of the first plate and the second plate; and
a spacer coupled to a first sidewall portion of the plurality of sidewall portions and disposed between the first plate and the second plate, wherein the spacer extends parallel to the first sidewall portion,
wherein an extension length of the spacer is shorter than an extension length of the first sidewall portion.

2. The deposition apparatus of claim 1, wherein the spacer is disposed on a center region of the first sidewall portion.

3. The deposition apparatus of claim 1, wherein the spacer is in direct contact with the first plate and the second plate.

4. The deposition apparatus of claim 1, wherein the second plate comprises first sides, opposite to each other, extending in a first direction and second sides, opposite to each other, extending in a second direction crossing the first direction,
wherein the spacer is a plurality of spacers,
wherein the plurality of spacer comprises:
first spacers extending along the first sides and facing each other; and
second spacers extending along the second sides and facing each other, and
wherein an extension length of each of the second spacers is shorter than an extension length of each of the first spacers.

5. The deposition apparatus of claim 4, wherein a ratio of an extension length of each of the first spacers to a length of the first side of the second plate ranges from about 60% to about 70%.

6. The deposition apparatus of claim 4, wherein a ratio of an extension length of each of the second spacers to a length of the second side of the second plate ranges from about 20% to about 30%.

7. The deposition apparatus of claim 1, wherein the second plate comprises:
a diffusion part including the plurality of diffusion holes; and
a peripheral part enclosing the diffusion part, wherein the spacer is disposed on the peripheral part.

8. The deposition apparatus of claim 1, wherein the heat dissipation member further comprises a plurality of bottom portions, wherein each of the plurality of bottom portions is bent from a bottom end of each of the sidewall portions and is disposed below the second plate, and
each of the sidewall portions comprises:
a first portion including an inner side surface connected to the first plate;
a second portion coupled to a bottom end of the first portion and including an inner side surface coupled to the spacer; and
a third portion connecting a bottom end of the second portion to the bottom portion of the heat dissipation member, wherein an inner side surface of the third portion is connected to the second plate.

9. The deposition apparatus of claim 1, wherein the spacer comprises a metallic material.

10. The deposition apparatus of claim 1, wherein the spacer comprises substantially a same material as that of the heat dissipation member.

11. The deposition apparatus of claim 1, wherein the second plate and the heat dissipation member are a single object.

12. The deposition apparatus of claim 1, wherein a bore penetrates the first plate, and
wherein the deposition apparatus further comprises a cylinder connected to the deposition source and surrounding the bore.

13. The deposition apparatus of claim 1, further comprising a voltage generator electrically connected to the second plate and configured to provide a voltage to the second plate to produce an electric field between the second plate and the stage.

14. The deposition apparatus of claim 1, wherein the spacer has a hexahedral shape.

15. The deposition apparatus of claim 1, wherein the spacer comprises a curved surface.

16. The deposition apparatus of claim 11, wherein the spacer includes tapered ends.

17. A deposition apparatus, comprising:
a chamber;
a deposition source including a deposition material;
a stage disposed in the chamber, wherein a target object is disposed on the stage and includes a deposition region;
a first plate facing the stage and coupled to the chamber to define a space;
a second plate disposed between the first plate and the stage;
a heat dissipation member connected to the first plate and the second plate, wherein the heat dissipation member comprises a plurality of sidewall portions that form a frame shape enclosing outer side surfaces of the first plate and the second plate; and
a plurality of spacers disposed between the first plate and the second plate, wherein each of the plurality of spacers is coupled to a sidewall portion of the plurality of sidewall portions and, and each of the plurality of spacers has a rod shape extending along the plurality of sidewall portions,
wherein the second plate comprises:
a diffusion part overlapping the deposition region, wherein a plurality of diffusion holes are provided in the diffusion part; and
a peripheral part at least partially surrounding the diffusion part,
wherein the plurality of spacers are spaced apart from each other on the peripheral part and are in direct contact with the first plate and the second plate.

18. The deposition apparatus of claim 17, wherein each of the spacers is disposed on a center region of an inner side surface of a corresponding one of the plurality of sidewall portions.

19. The deposition apparatus of claim 18, wherein the spacers comprise a metallic material.

20. A deposition apparatus, comprising:
a chamber;
a deposition source including a deposition material;
a stage disposed in the chamber, wherein a target object is mounted on the stage and includes a deposition region;
a first plate overlapping the stage and coupled to the chamber to define a space;
a second plate disposed between the first plate and the stage, wherein the second plate comprises a first side extending in a first direction and a plurality of diffusion holes overlapping the deposition region;
a heat dissipation member connected to the first plate and the second plate, wherein the heat dissipation member includes a first sidewall portion extending in the first direction; and
a first spacer coupled to the first sidewall portion of the heat dissipation member and disposed between the first plate and the second plate, wherein the first spacer has a rectangular shape extending in the first direction,
wherein a length of the first spacer in the first direction is shorter than a length of the first side in the first direction.

* * * * *